United States Patent

Friberg

[15] 3,657,654

[45] Apr. 18, 1972

[54] COMMUNICATIONS RECEIVER EMPLOYING VARACTOR CONTROLLED TUNING STAGES

[72] Inventor: Vincent P. Friberg, Leonia, N.J.

[73] Assignee: General Instrument Corporation, Newark, N.J.

[22] Filed: Sept. 11, 1969

[21] Appl. No.: 857,150

[52] U.S. Cl. ....................325/452, 325/368, 334/15

[51] Int. Cl. ....................H04b 1/16, H03j 3/28

[58] Field of Search ....................325/368, 383, 452, 453, 454, 325/457, 468, 416; 334/14, 15; 331/36

[56] References Cited

UNITED STATES PATENTS

| | | | |
|---|---|---|---|
| 3,249,876 | 5/1966 | Harrison | 325/453 |
| 2,958,768 | 11/1960 | Brauer | 325/416 X |

*Primary Examiner*—Robert L. Richardson

*Attorney*—James and Franklin

[57] ABSTRACT

In a communications receiver the local oscillator output signal is converted to a voltage signal proportional to the oscillator frequency. That voltage signal is applied to the voltage-sensitive tuning elements in the receiver's tuning stages to vary the tuning parameters of these elements. An improved frequency-to-voltage converter effectively converts the oscillator output to the tuning voltage signal.

11 Claims, 4 Drawing Figures

INVENTOR
VINCENT P. FRIBERG
BY James and Franklin
ATTORNEY

INVENTOR
VINCENT P. FRIBERG
BY James and Franklin
ATTORNEY

INVENTOR
VINCENT P. FRIBERG
BY [signature]
ATTORNEY

COMMUNICATIONS RECEIVER EMPLOYING VARACTOR CONTROLLED TUNING STAGES

The present invention relates generally to communication receivers, and particularly to a tuning system for such receivers in which the tuning elements are in the form of signal-sensitive variable elements.

A superheterodyne receiver includes a number of tunable stages connected between the antenna and the IF stage of the receiver. These tunable stages typically comprise an antenna stage, an RF amplifier stage, and a local oscillator, which are tuned simultaneously. The outputs of the RF amplifier and the local oscillator are applied to a mixer stage which produces an IF signal corresponding to the difference between the RF frequency and the local oscillator frequency.

In the majority of such receivers the tuning of these stages is effected by means of a ganged capacitor having a number of capacitor sections, one of which is electrically connected in each of the tunable stages. The ganged capacitor sections are rotated to tune each of the receiver stages to the desired resonant frequency. This conventional arrangement has several drawbacks. The mechanically ganged capacitor is a relatively bulky and heavy component. Problems often arise in tracking between the tunable stages because the capacitance characteristics of the capacitor sections are not always identical over the entire tuning range. Thus, great care must be exercised in designing the capacitor so that the capacitance characteristics in each capacitor section are substantially the same, or else adjustment and calibration operations must be carried out. All of this adds appreciably to the cost of the receiver.

Tuning of these tunable stages may also be effected by the use of a permeability tuner which is essentially a ganged variable inductor in which the inductance values may be adjusted by varying the position of a tuning element. This too requires the use of relatively bulky components in a receiver and also raises difficulty in maintaining tracking between all tuning stages over the entire frequency band.

To reduce the size of tuning elements for use in receivers, such as in portable AM, FM and TV receivers, it has been proposed that the capacitance-voltage characteristic of voltage-variable capacitance diodes be utilized in tuning circuits. These diodes when back biased exhibit a value of capacitance which is proportional to the biasing voltage applied thereto. These diodes, or varactors as they are often referred to, may be substituted for the mechanical tuning elements described above in the receiver tuning stages and are tuned by applying a predetermined DC voltage across their terminals. That tuning voltage is conventionally supplied to the varactors from a potentiometer having a movable element which is rotated to vary the level of that tuning voltage. For optimum tuning performance and accurate tracking between the tuning stages, the capacitance-voltage characteristics of the tuning varactors in all tuning stages should be closely matched and the voltage characteristics of the potentiometer as a function of its position should correspond to the varactor characteristics.

The use of the potentiometer in the known varactor-tuned receivers is the prime source of difficulty in these receivers as it involves the use of a large and relatively bulky component in the receiver. Moreover, due to the tendency for the mechanical properties of the potentiometer to vary as a result of use, the relationship between the potentiometer rotational position and its value of resistance, and hence the value of the tuning voltage provided by a given potentiometer position or setting, varies over a period of time, and as a result the dial indication no longer accurately represents the actually selected frequency. As a result, the use of varactors as tuning elements in receivers has so far been somewhat limited.

It is an object of the present invention to provide a tuning system utilizing varactors as the tuning elements in which the need for a potentiometer is eliminated.

It is a more general object of the present invention to provide a receiver tuning system in which the need for mechanical tuning elements is reduced to a considerable degree.

It is another object of the present invention to provide a receiver tuning system which provides for excellent tracking between the various tuning stages and thus provides for greater accuracy and reliability of receiver tuning.

It is a further object of the present invention to provide an AM-FM tuner in which one of the tuning sections is a conventional mechanically tuned section and the other section comprises varactor tuned stages, in which the local oscillator of the conventionally tuned section is utilized to supply tuning voltages to the varactors in the other section.

It is still another object of the present invention to provide an improved frequency-to-voltage converter circuit in which the output voltage is an accurate representation of the frequency of the input signal.

It is yet a further object of the present invention to provide an improved frequency-to-voltage converter to produce a tuning signal for a varactor-tuned stage, in which the frequency-to-voltage characteristic of the converter corresponds closely to the voltage-capacitance characteristic of the varactor.

The receiver of the present invention comprises a number of tunable stages which utilize a signal-sensitive variable tuning device, such as a varactor, as a tuning element. These devices have a tuning parameter which is variable in accordance with the magnitude of the tuning signal applied thereto. The tuning system comprises a local oscillator stage which may be conventionally tuned; that local oscillator produces a signal of desired frequency. That signal is fed to the mixer stage as is conventional, and it is also fed to a frequency-to-voltage converter which produces from that oscillator signal a tuning signal corresponding in magnitude to the frequency of the local oscillator signal. That tuning signal is operatively applied to the variable tuning devices in the receiver tuning stages. In this manner the tuning parameter of the variable tuning devices is established at a value corresponding to the desired selected frequency of the receiver.

The tuning system of this invention may be used in an AM-FM tuner in which one of the tuners, e.g., the AM tuner, is tuned conventionally throughout but in which the other tuner, e.g., the FM tuner, is varactor-tuned in all of its tunable stages. The tuning signals for tuning these varactors is derived from a frequency-to-voltage converter which receives its input signal from the local oscillator of said one of said tuners.

To achieve optimum tracking over the entire frequency range of interest, the tuning voltage-frequency characteristic should correspond appropriately to the voltage-capacitance characteristic of the varactor for tuning over that range. To this end the system of the present invention utilizes a novel frequency-to-voltage converter circuit to provide the varactor tuning signals. That circuit comprises a frequency comparison circuit, such as a discriminator, having a resonant circuit including a varactor as one of its tuning elements. The comparison circuit senses a deviation between the input frequency and the resonant frequency and produces a DC "error" signal corresponding to this deviation.

That error signal is amplified and fed back to the resonant circuit to vary the capacitance of the varactor, thereby to bring the resonant frequency of the discriminator into substantial correspondence with the input frequency. The amplified error signal constitutes the tuning signal for the varactors in the receiver tunable stages and is related to the input frequency. That tuning signal corresponds to the tuning characteristic of the varactor in the discriminator resonant circuit, and since that varactor has characteristics similar to those of the varactors used in the tunable stages of the receiver, the tuning stages will closely track the input frequency to the frequency-to-voltage converter. As herein described the input frequency signal to the converter is derived from the receiver local oscillator which may be tuned by conventional means (e.g. mechanical) to select the desired tuned frequency. Thus the use of the novel frequency-to-voltage converter to provide tuning signals to the tuning stages in the varactor tuned receiver system facilitates precise tracking of the varactor tuned stages over the frequency range of interest.

To accomplishment of the above, and to such other objects as may hereinafter appear, the present invention relates to a varactor controlled tuning system and the elements thereof as defined in the appended claims and as described in this specification, taken together with the accompanying drawings, in which:

Figure 1:
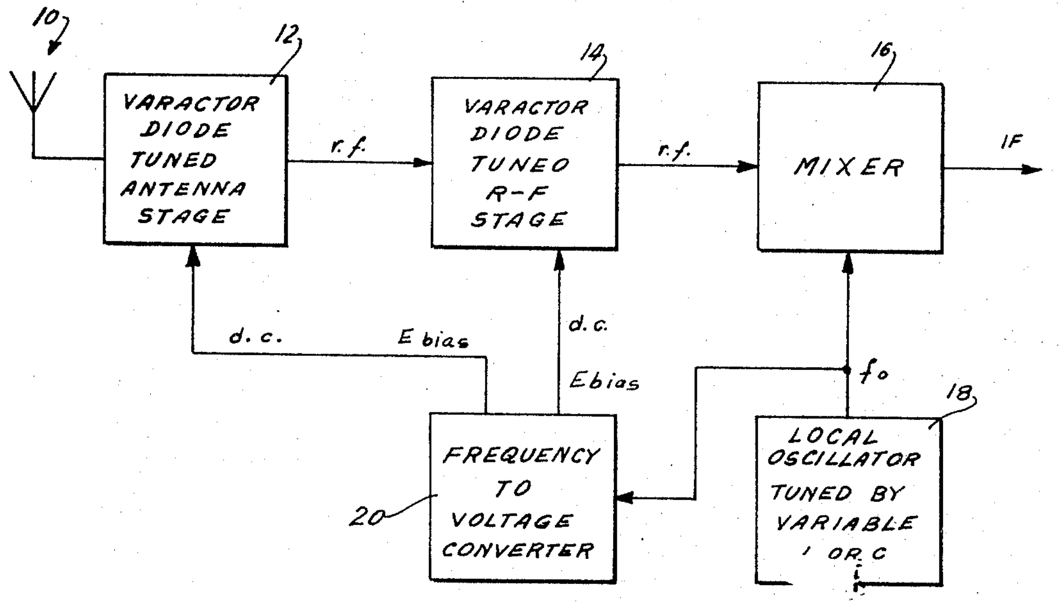
FIG. 1 is a block diagram of a communications receiver in which the tuning system of the present invention is incorporated.

A receiver front end embodying the features of the present invention is illustrated in block diagram form in FIG. 1. As is conventional, the transmitted RF signal is picked up by the antenna 10 which couples the received RF signal to a tuned antenna stage 12. The output RF signal from stage 12 is connected to a tuned r.f. amplifier stage 14, the output of which is connected to a mixer 16. A tuned local oscillator 18 produces a signal at its output at a frequency which is typically less than the received RF signal by a predetermined amount, that signal being applied to the other input of mixer 16. As is conventional mixer 16 compares its two input signals to produce at its output an IF signal at a frequency equal to the difference between the RF and local oscillator signal frequencies.

In a conventional receiver, stages 12, 14 and 18 are simultaneously tuned by means such as a ganged capacitor or a variable inductor assembly having a plurality of sections, one section being provided for each tuned stage. Each section is adjusted so that, in conjunction with other circuit elements, it establishes a resonant circuit tuned at a proper frequency.

In the receiver system of the present invention antenna stage 12 and RF amplifier stage 14 have tuning circuits which include signal-sensitive variable tuning means which, as herein specifically disclosed, are in the form of voltage variable capacitance diodes or varactor diodes which have a tuning parameter, e.g., capacitance, which varies in accordance with the magnitude of the tuning signal or voltage applied thereto. In the system of the present invention that tuning signal is supplied to the variable-capacitance tuning diodes by a frequency-to-voltage converter 20 which receives as its input the output signal of local oscillator 18 and produces at its output a DC voltage output signal corresponding in magnitude to the frequency of the input local oscillator signal. The output signal of converter 20 is the tuning signal for the variable capacitance diodes in tunable stages 12 and 14. Oscillator 18 may be tuned by conventional means such as by the use of a variable permeability inductor, which may be adjusted varying the position of a tuning core, or by a single section variable capacitor. Both of these tuning means are well known in the art and requires no further description herein.

The system of the present invention thus provides a DC tuning signal or voltage to the variable capacitance diodes in the tuning stages without the requirement of mechanical rotational elements such as potentiometers which have heretofore been required in comparable varactor-tuned receivers. That tuning voltage is an accurate representation of the local oscillator frequency and thus represents the desired tuned RF signal for the receiver.

Figure 2:
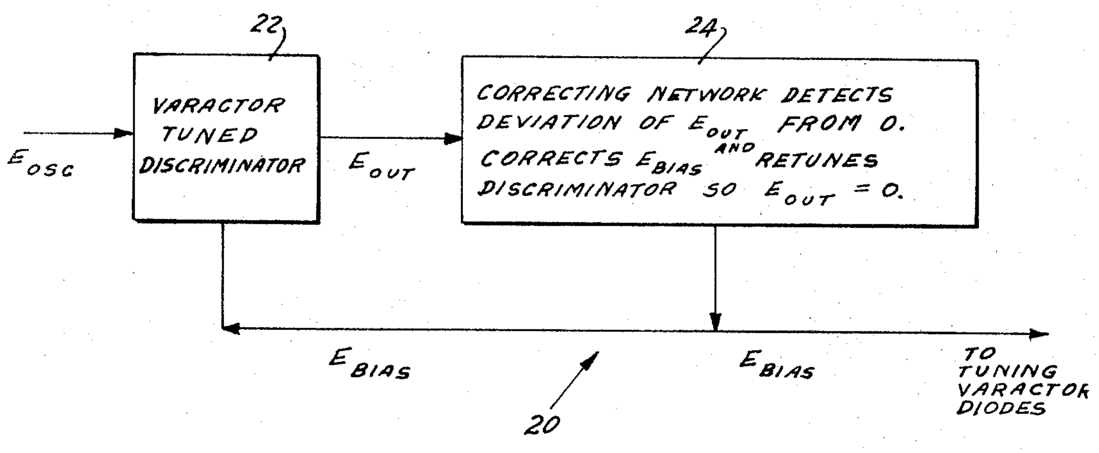
FIG. 2 is a block diagram of the frequency-to-voltage converter utilized in the system of FIG. 1.

FIG. 2 illustrates in block diagram form the frequency-to-voltage converter 20 of FIG. 1 and describes briefly its manner of operation. The input signal from the local oscillator 18, $E_{osc}$, is operatively applied to a tuned stage of a frequency comparing circuit such as a phase-shift discriminator 22 which, itself, comprises a tuning, variable capacitance diode in a tuned circuit. That tuned circuit is tuned to a nominal frequency which is preferably outside the band of frequencies to be tuned by the receiver front end stages. Discriminator 22 compares the frequency of the output signal $E_{osc}$ of local oscillator 18 and the nominal frequency of the tuned circuit of discriminator 22, and produces in a known manner a DC "error" signal, $E_{out}$, proportional to the difference between these frequencies. That error signal $E_{out}$ is connected to the input of a correcting network 24 which amplifies the error signal and feeds it back to the variable capacitance diode in the discriminator tuned circuit, thereby to change its value of capacitance in a manner such that the tuned frequency of the discriminator tuned circuit is brought into substantial correspondence with the frequency of the input signal $E_{osc}$. That amplified feed-back voltage maintains the discriminator tuned circuit at that frequency and thus defines an electronic servo loop or system which tends to maintain $E_{out}$ at a zero level by matching the resonant frequency of the discriminator 22 with the frequency of the oscillator signal. The feed-back voltage used to adjust the capacitance of the variable capacitance diode in discriminator 22 thus defines the tuning signal output of converter 20 which, as shown in FIG. 1, is operatively applied to the tunable variable capacitance diodes in stages 12 and 14.

Figure 3:
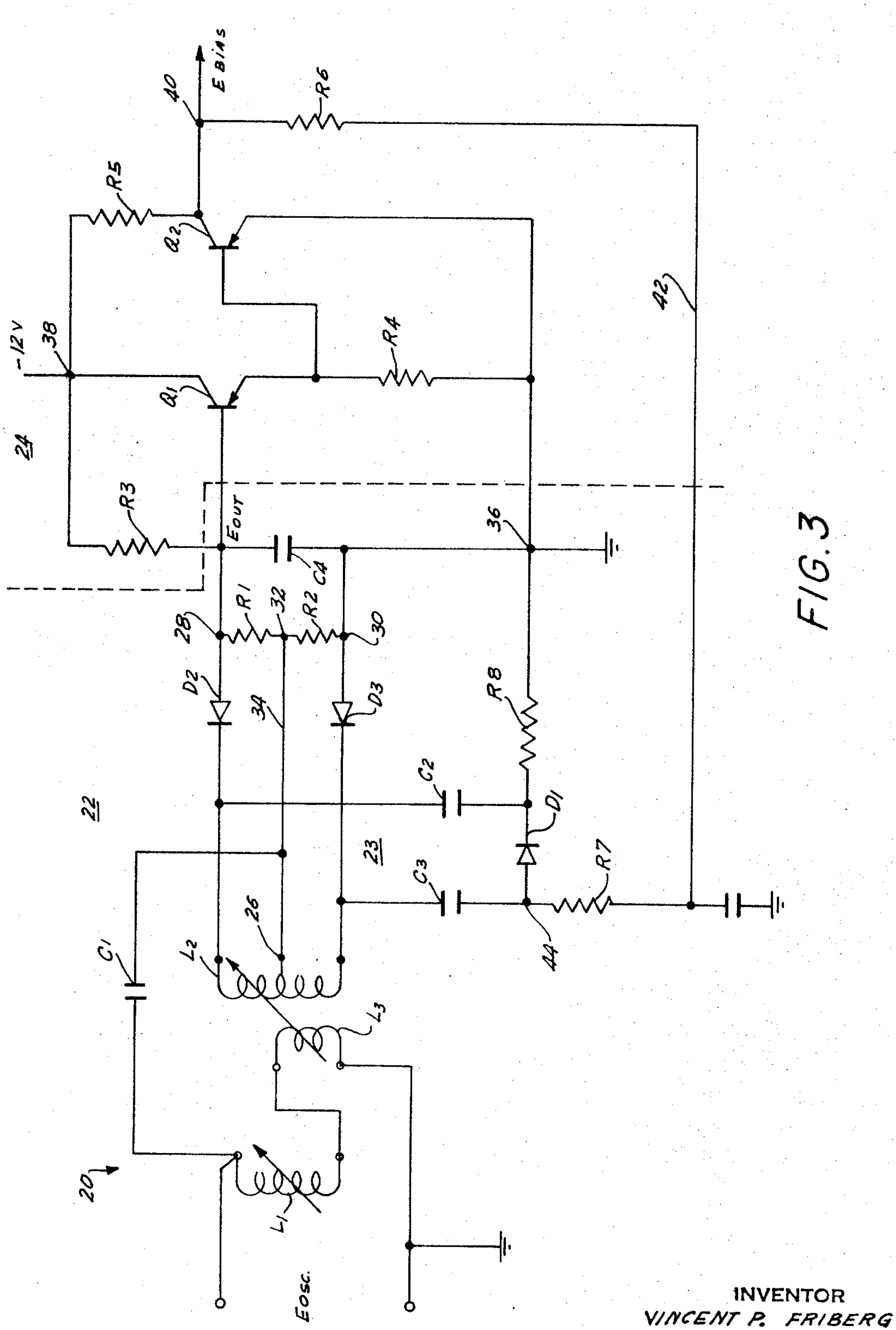
FIG. 3 is a schematic diagram of the frequency-to-voltage converter in FIG. 2.

An exemplary schematic diagram of frequency-to-voltage converter 20 is shown in FIG. 3, in which the oscillator input signal $E_{osc}$ is applied to an inductor L1 which has its upper end connected through a DC blocking capacitor C1 to a center tap 26 of an inductor L2. The lower end of inductor L1 is connected to an inductor L3 which is in close inductive coupling relation with inductor L2. In this manner the input signal $E_{osc}$ from oscillator 18 is inductively coupled to the remainder of the discriminator circuit 22, which comprises a tuned circuit 23 in which inductor L2 is connected in resonant circuit relationship with capacitors C2 and C3, and the capacitance of a voltage-variable capacitance diode D1. As in a conventional discriminator circuit, the upper and lower ends of inductor L2 are connected through diodes D2 and D3 respectively, to points 28 and 30. Resistors R1 and R2 are connected in series between points 28 and 30 and define a point 32 at their junction which is connected by line 34 to the center tap 26 of inductor L2. A capacitor C4 is connected in parallel across points 28 and 30 and is connected to ground at point 36.

Discriminator 22 is effective as described above to compare the frequency of input signal $E_{osc}$ to the tuned resonant frequency of its tuned circuit 23 and to produce across capacitor C4 a DC signal corresponding to the difference between these frequencies. That DC signal, $E_{out}$, is applied to the input of correcting network 24 which includes transistors Q1 and Q2 having the conventional base, emitter and collector terminals. The base of transistor Q1 is connected to point 28 and thus receives the output signal from discriminator 22 and its collector is connected to the B plus supply at point 38 which is also connected through a resistor R3 to point 28. Resistor R3 serves to establish a bias condition to the base of transistor Q1, and also establishes a reference voltage applied to voltage capacitance diode D1 normally (in the absence of any $E_{osc}$ input) to establish its capacitance at a value effective to tune the tuned circuit 23 of discriminator circuit 22 so that the discriminator cross over point is at a frequency (nominal frequency) to one side or the other, and preferably on the low side, of the frequency range over which the system is to be tuned. Hence any $E_{osc}$ within the applicable frequency range will produce an output signal $E_{out}$ from the discriminator. The magnitude of that output signal will vary depending on the difference between the frequency of $E_{osc}$ and the crossover frequency of the discriminator. The emitter of transistor Q1 is connected to ground through a resistor R4 and to the base of emitter Q2, the collector of which is connected to point 40 at which the E tuning signal is developed and to point 38 via resistor R5. The emitter of transistor Q2 is connected to ground. Point 40 is connected in feedback relation through resistor R6, line 42, and resistor R7 to variable capacitance diode D1, the latter being connected in series with a resistor R8 between ground point 36 and point 44 defined at the junction of resistor R7 and diode D1.

The output signal $E_{out}$ of discriminator 22 is applied to correcting network 24 which effectively amplifies that signal and feeds it back to the variable capacitance diode D1 to adjust its value of capacitance, thereby to bring the resonant frequency of tuned circuit 23 into substantial correspondence with the frequency of the input signal. There is a narrow control range when variations in the frequency of $E_{osc}$ will cause graduated variations in the fed-back bias to the viable capacitance diode D1, thereby causing graduated variations in its effective capacitance. Outside that control range the fed-back bias is either maximum or minimum, producing in capacitor D1 minimum or maximum capacitance, thereby quickly to bring the system back into said control range. Since the combination of discriminator 22 and correcting network 24 constitutes a servo loop, the DC level of the tuning signal E bias at point 30 is substantially independent of variations in the B plus power supply as the feedback circuit tends to correct for deviations in that supply by feeding back a larger portion of the available B plus voltage to the variable capacitance diode D1 when the B plus supply decreases, in order to establish the proper tuning voltage at diode D1 to adjust circuit 23 to be resonant at substantially the input signal frequency.

The variable capacitance diode D1 in discriminator 22 is preferably identical to and thus has the same voltage-capacitance characteristic as the variable capacitances used to tune stages 12 and 14. Since the tuning voltage adjusts the capacitance of variable capacitance Diode D1 to a specified voltage for tuning discriminator 22 to the desired frequency, it will have a similar effect on the variable capacitance tuning diodes in stages 12 and 14 over the entire frequency range of interest. As a result, tunable stages 12 and 14 track along with local oscillator 18 over substantially the entire tuning range.

The output impedance of amplifier network 24 is low so that the source of the DC tuning voltage signal to the RF tuning stages 12 and 14 is low impedance source. Moreover, the network 24 produces only a negligible loading on the discriminator tuned circuit as a result of its high input impedance so that the Q of the discriminator tuned circuit is maintained high, as is desired.

By appropriate selection or adjustment of L2 and C2 and L3 the end points of the voltage-frequency curve of the discriminator circuit can be adjusted. Increasing $C_2$ and/or $C_3$ results in a decreased voltage excursion, and vice versa. Changing L2 causes both end points of voltage to move, both in the same direction. Hence the end point voltages can readily be located where desired, within limits. As a result the circuit can readily be adapted to the needs of the particular tuner in which it is to be used.

Figure 4:
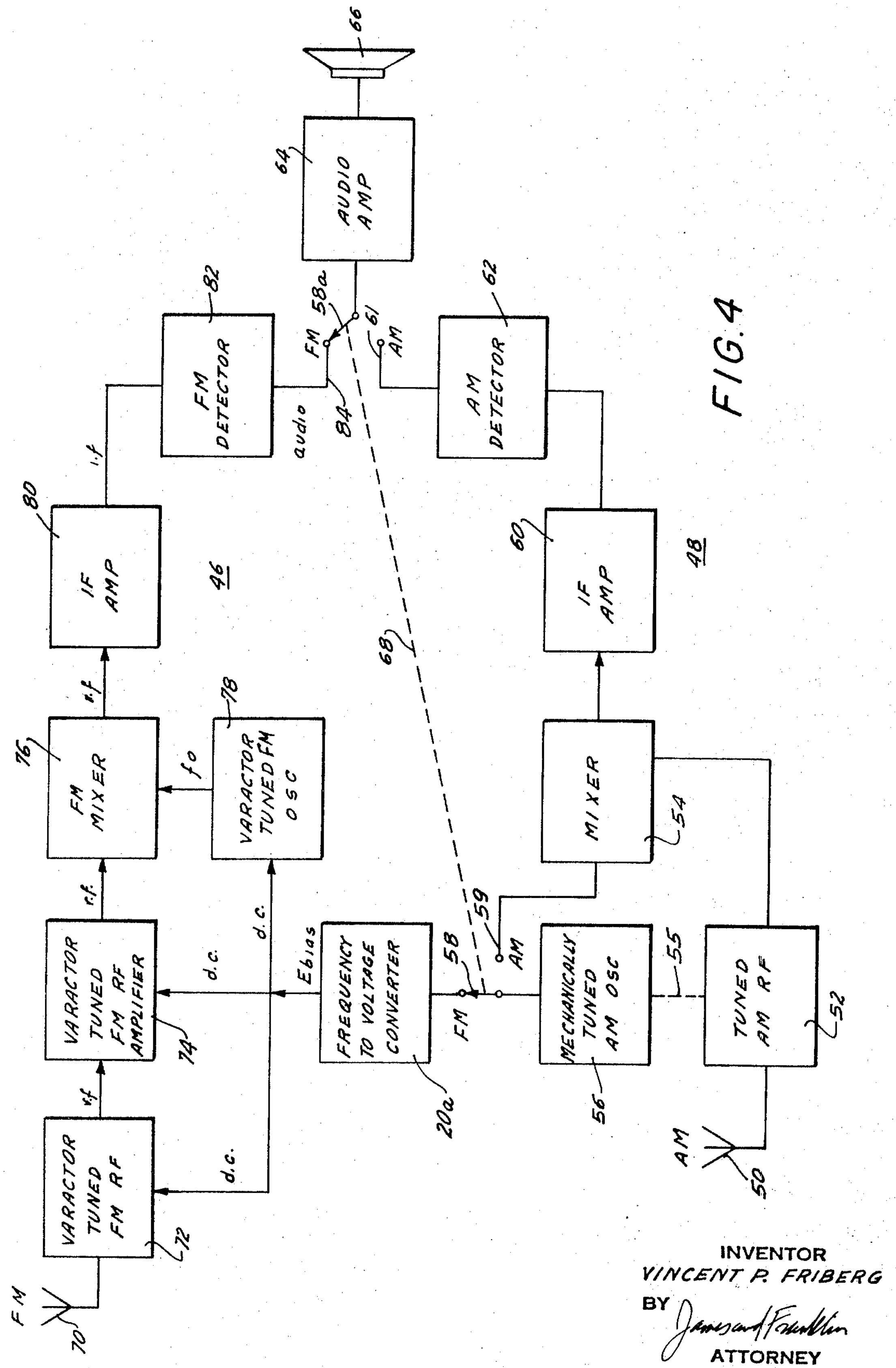
FIG. 4 is a block diagram of an AM-FM receiver in which the FM receiver section incorporates the tuning system of the present invention, and in which the AM local oscillator is utilized to provide a signal from which the FM tuning signal is developed.

FIG. 4 illustrates one way of using the varactor-controlled tuning system of this invention in an AM-FM tuner which comprises an FM tuning section generally designated 46 and an AM tuning section generally designated 48. As shown the AM section 48 is conventional and comprises an antenna 50 connected to a tuned RF amplifier 52 the output of which is applied to the input of AM mixer 54. AM section 48 further comprises a conventional mechanically tuned local oscillator 56 which, when the band selector switch 58 is connected to the AM side at 59, has its output connected to the input of mixer 54. Local oscillator 56 and the r.f. amplifier 52 are simultaneously tuned such as by a ganged capacitor, the mechanical connection between the capacitor sections in these stages being illustrated schematically by the broken line 55. Mixer 54 compares the local oscillator signal and the tuned RF signal to produce an IF signal which in turn is connected to an IF amplifier 60. The output IF signal of amplifier 60 is connected to AM detector 62 which demodulates the IF signal to produce an audio signal which, when band selector switch **58*a* engages the AM side at 61, is connected to an audio amplifier 64 the output of which is connected to an output such as a loudspeaker 66. Band selector switches 58 and 58*a* are linked by mechanical means schematically illustrated at 68 so as to operate together. The FM section 46 comprises an FM antenna 70 which is connected to the input of a tuned FM-RF stage 72, the output of which is connected to an FM-RF amplifier stage 74. The output signal from amplifier 74 is connected to one input of FM mixer 76 which receives at its other input the local signal produced by FM local oscillator 78. Mixer 76 compares its two input signals and produces, as described above, an IF signal which is connected to an IF amplifier 80, the output of which is connected to an FM detector 82, which produces an FM audio signal. When switch 58*a* is in its FM selector position at 84 the audio signal output of FM detector 82 is connected to audio amplifier 64 to produce the FM audio signal at loudspeaker 66**.

In FM section 46, RF stage 72, RF amplifier 74 and local oscillator 78 are all tuned by the use of variable capacitance diodes, in contrast to the system of FIG. 1, in which local oscillator 18 was tuned by conventional mechanical means. The tuning signal for the diodes in each of these stages is produced by a frequency-to-voltage converter **20*a* which receives its input signal from the mechanically tuned AM local oscillator 56 the output of which is connected thereto during FM operation through switch 58. The manner in which converter 20*a* produces the tuning voltage signal from its input signal is substantially the same as that described above except that the variable capacitance diode in converter 20*a* is tuned to adjust the discriminator tuned circuit to correspond to the frequency of the AM local oscillator signal. Corresponding adjustments will have to be made to the varactor tuned FM stages 72, 74 and 48, so that they are tuned over the desired FM frequency range in response to a tuning voltage which is produced in response to the selected AM frequency. The AM-FM receiver of FIG. 4 has only one mechanically tuned local oscillator 56, the output of which is applied to the AM section 48 when the receiver is operated to receive signals in the AM band. When the receiver is operated to receive signals in the FM band, oscillator 56 is connected to frequency-to-voltage converter 20*a* to produce a DC signal for use in turning the varactors in the FM tuning stages. Station selection in both AM and FM bands is effected by tuning the AM local oscillator 56. The FM section 46 is tuned entirely by the use of variable capacitance diodes and requires no mechanical tuning means even for tuning the FM local oscillator 76 as was required in the system of FIG. 1**.

The receiver tuning system of the present invention employs variable capacitor diodes in at least some of its tuning stages. The tuning signals for adjusting the tuning parameters of these diodes are supplied by means of electronic circuitry rather than mechanical elements such as potentiometers which have heretofore been required for circuits of this type. The elimination of potentiometers for this purpose greatly increases the reliability and accuracy of the tuning operation over long periods of use, and enables the receiver to be packaged in a smaller space than has heretofore been practical. Moreover, the receiver utilizing the tuning system of this invention can be subjected to shock and vibration without any adverse effects upon its tuning reliability, thus contrasting favorably from the prior art varactor-tuned receivers in which such shock and vibration often would vary the resistance characteristics of the potentiometer.

The varactor tuning signal is derived from a novel frequency-to-voltage converter which supplies an output voltage of sufficient amplitude range to tune the tuning varactors in the applicable stages over the entire frequency range of interest. It does this by providing a variable capacitance diode in its own tuned circuit which has a similar voltage-capacitance characteristic as those diodes used in the varactor-tuned stages. Thus the voltage produced by the converter to adjust its tuned circuit tunes the varactor stages to a corresponding frequency, and enables the varactor stages to track with each other and with the local oscillator along substantially the entire frequency range of interest.

The system of the present invention can be used to advantage in an AM-FM receiver in which at least one of the sections (herein shown as the FM section) can be completely tuned by the use of variable capacitance diodes and thus does require no mechanical tuning elements. This even further improves the reliability and accuracy of the receiver operation as compared to the single section receiver shown in FIG. 1, in which only the local oscillator was tuned by conventional, mechanical means.

In this specification the term "varactor" has been used in a generic sense to mean any component the electrical parameter of which is varied by changes in an electrical signal, usually voltage, applied thereto.

While only a single embodiment of the present invention has been herein specifically disclosed, it will be apparent that many variations can be made thereto without departing from the spirit and scope of the invention.

I claim:

1. A communication receiver tunable to receive signals within a specified range of frequencies, said receiver comprising at least one tunable stage comprising signal-sensitive variable tuning means having a tuning parameter which varies with the magnitude of a tuning signal applied to said means, a variable frequency source, means to selectively vary the frequency of the output of said source, means operatively connected to said frequency source and effective to produce a tuning signal having a magnitude related to the frequency of the output of said source, and means effective to apply said tuning signal to said variable tuning means to vary said parameter of the latter, thereby to tune said tunable stage to a selected frequency corresponding to said tuning parameter, in which said tuning signal producing means comprises a tracking discriminator having an input operatively connected to said frequency source and further comprising a tuned circuit having a nominal resonant frequency and including second signal-sensitive variable tuning means to vary the resonant frequency of said tuned circuit, means connecting said tuned circuit to said input, thereby to apply the output of said frequency source to said tuned circuit, means operatively connected to said tuned circuit and effective to compare the frequency of the signal at said input with the resonant frequency of said tuned circuit and to produce an error signal corresponding to the difference therebetween, amplifier means having an input operatively connected to said comparing means and having an output, said amplifier means being effective to amplify said error signal, means operatively connected to said amplifier output and said second signal-sensitive tuning means and effective to apply said amplified error signal to said second signal-sensitive variable tuning means in a sense to vary the parameter of said tuning means to bring the resonant frequency of said tuned circuit substantially into correspondence with the frequency of said input signal from said frequency source.

2. The receiver of claim 1, in which said tuning means comprises voltage-variable capacitance means, said tuning signal producing means comprising means effective to produce substantially a DC voltage having a magnitude proportional to the frequency of the output of said variable frequency source.

3. The receiver of claim 2, said tunable stage comprising an rf amplifier stage and a mixer stage each of which comprises one of said variable tuning means, said tuning signal applying means being effective to apply said tuning signal to each of said variable tuning means, said variable frequency source comprising the receiver local oscillator stage.

4. In the receiver of claim 3, means effective to operatively connect said amplifier output to said first mentioned signal-sensitive tuning means, said amplified error signal defining said tuning signal.

5. The receiver of claim 4, in which said second signal-sensitive variable tuning means comprises second voltage-variable capacitance means, and comprising means effective to apply a bias signal to said second voltage-variable capacitance means, thereby to tune said tuned circuit to said nominal frequency, said nominal frequency being outside said specified range of frequencies.

6. In the receiver of claim 2, an output stage, first and second tuning sections effective to receive signals within first and second discrete frequency bands respectively, each of said tuning sections comprising a plurality of tuning stages operatively connected together, selecting means effective to selectively operatively connect one of said first and second tuning sections to said output stage, at least some of said tuning stages of said first tuning section comprising a said signal-sensitive variable tuning means, said selecting means being effective when said first tuning section is operatively connected to said output stage to operatively connect the frequency source of said second tuning section to said tuning signal producing means, said tuning signal producing means being operatively connected to said signal sensitive variable timing means in said first tuning section.

7. The receiver of claim 6, in which said first frequency band is the FM band, and said second frequency band is the AM band.

8. The receiver of claim 1, in which said second signal-sensitive variable tuning means comprises second voltage-variable capacitance means, and comprising means effective to apply a bias signal to said second voltage-variable capacitance means, thereby to tune said tuned circuit to said nominal frequency.

9. The receiver of claim 1, in which said second signal-sensitive variable tuning means comprises second voltage-variable capacitance means, and comprising means effective to apply a bias signal to said second voltage-variable capacitance means, thereby to tune said tuned circuit to said nominal frequency, said nominal frequency being outside said specified range of frequencies.

10. The receiver of claim 1, comprising means effective to apply a reference signal to said second signal-sensitive tuning means, thereby to tune said tuned circuit to said nominal frequency, said nominal frequency being outside said specified range of frequencies.

11. The receiver of claim 10, in which said amplifier means comprises a first transistor having an input operatively connected to said tuned circuit, and an output, and a second transistor having an input operatively connected to the output of said first transistor and an output operatively connected to said second signal-sensitive variable tuning means.

* * * * *